United States Patent
Ishizuka

(10) Patent No.: US 9,698,831 B2
(45) Date of Patent: Jul. 4, 2017

(54) TRANSFORMER AND COMMUNICATION TERMINAL DEVICE

(71) Applicant: Murata Manufacturing Co., Ltd., Nagaokakyo-shi, Kyoto-fu (JP)

(72) Inventor: Kenichi Ishizuka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/145,196

(22) Filed: May 3, 2016

(65) Prior Publication Data

US 2016/0248450 A1 Aug. 25, 2016

Related U.S. Application Data

(63) Continuation of application No. PCT/JP2014/078689, filed on Oct. 29, 2014.

(30) Foreign Application Priority Data

Nov. 5, 2013 (JP) .................................. 2013-228966

(51) Int. Cl.
*H01F 19/04* (2006.01)
*H04B 1/00* (2006.01)
(Continued)

(52) U.S. Cl.
CPC ....... *H04B 1/0053* (2013.01); *H01F 17/0013* (2013.01); *H01F 27/245* (2013.01);
(Continued)

(58) Field of Classification Search
CPC .............................. H01F 17/0033; H01F 19/04
(Continued)

(56) References Cited

U.S. PATENT DOCUMENTS 8,773,232 B2 * 7/2014 Kato ................... H01F 27/2804
336/200
2010/0127812 A1 * 5/2010 Maeda ................ H01F 17/0013
336/200
(Continued)

FOREIGN PATENT DOCUMENTS

JP 2009-44030 A 2/2009
JP 2009-94149 A 4/2009
(Continued)

OTHER PUBLICATIONS

Official Communication issued in International Patent Application No. PCT/JP2014/078689, mailed on Jan. 20, 2015.
(Continued)

*Primary Examiner* — John J Lee
(74) *Attorney, Agent, or Firm* — Keating & Bennett, LLP

(57) ABSTRACT

In a transformer, first and second coils are provided on different substrate layers of a multilayer body. The first and second coil conductors are interlayer-connected to each other by interlayer connection conductors. A coil aperture defined by the first coil conductor and a coil aperture defined by the second coil conductor overlap each other when seen in a plan view from a laminating direction of the multilayer body. The first and second coil conductors are connected to each other at at least two places with the interlayer connection conductors interposed therebetween. A parallel connection portion including a first portion of the first coil conductor and a first portion of the second coil conductor is provided, and a series connection portion including a second portion of the first coil conductor and a second portion of the second coil conductor is provided.

20 Claims, 7 Drawing Sheets

(51) Int. Cl.
*H03H 7/38* (2006.01)
*H01F 17/00* (2006.01)
*H01F 27/245* (2006.01)
*H01F 27/28* (2006.01)
*H01F 27/29* (2006.01)
*H04B 1/40* (2015.01)
*H04W 88/06* (2009.01)

(52) U.S. Cl.
CPC ......... *H01F 27/2804* (2013.01); *H01F 27/29* (2013.01); *H03H 7/38* (2013.01); *H04B 1/40* (2013.01); *H04W 88/06* (2013.01); *H01F 2027/2809* (2013.01)

(58) Field of Classification Search
USPC ............. 455/269, 274, 279.1, 286, 292
See application file for complete search history.

(56) References Cited

U.S. PATENT DOCUMENTS

| | | |
|---|---|---|
| 2010/0253464 A1 | 10/2010 | Miyoshi et al. |
| 2012/0139814 A1 | 6/2012 | Ishizuka et al. |
| 2012/0274431 A1* | 11/2012 | Kato ................... H01P 1/20345 336/182 |
| 2013/0249767 A1 | 9/2013 | Ishizuka et al. |
| 2013/0307746 A1* | 11/2013 | Nakano ................ H01Q 1/2225 343/850 |

FOREIGN PATENT DOCUMENTS

| | | |
|---|---|---|
| JP | 2010-245134 A | 10/2010 |
| JP | 4761009 B1 | 8/2011 |
| JP | 2012-085306 A | 4/2012 |
| JP | 2012-191596 A | 10/2012 |
| JP | 2013-21592 A | 1/2013 |
| JP | 2013-222841 A | 10/2013 |
| WO | 2009/016937 A1 | 2/2009 |
| WO | 2012/099085 A1 | 7/2012 |

OTHER PUBLICATIONS

Official Communication issued in corresponding Japanese Patent Application No. 2015-546610, mailed on May 16, 2017.

* cited by examiner

TRANSFORMER AND COMMUNICATION TERMINAL DEVICE

BACKGROUND OF THE INVENTION

1. Field of the Invention

The present invention relates to a transformer and a communication terminal device that includes the transformer.

2. Description of the Related Art

As wireless communication devices such as cellular phone terminals become smaller, there is a tendency that antennas become smaller and impedance thereof becomes lower. To match an antenna having an impedance that is significantly lower than that of a power feeding circuit, with the power feeding circuit by using a reactance element, that is, when the impedance conversion ratio is great, the frequency band to match becomes narrow.

Meanwhile, when a single antenna is used to handle a plurality of communication systems, such as a low-band (e.g., 800 MHz frequency band) communication system and a high-band (e.g., 2 GHz frequency band) communication system, a basic resonant mode and a high-order resonant mode of one radiating element are used. However, the impedance of the radiating element is different in accordance with frequency. When a matching circuit for matching in one frequency band is provided, this matching circuit is incapable of matching in the other frequency band.

In order to solve the above-described problem, there is proposed an impedance converting circuit in which a transformer circuit is used as a matching circuit, as described in Japanese Patent No. 4761009.

In general, when the primary coil and the secondary coil of a transformer have an identical shape, the closer they are arranged to each other, the higher the coupling coefficient between the primary coil and the secondary coil. When a transformer is configured in a multilayer body including a plurality of substrate layers that are laminated, the coupling coefficient becomes higher if loop-shaped coil conductors are positioned closely to each other in a direction in which the substrate layers are laminated.

To connect one coil conductor to another coil conductor or to an external terminal, it is necessary to form wiring outside the areas where the coil conductors are formed. Because of this wiring, which contributes nothing to the coupling between the primary coil and the secondary coil, the coupling coefficient between the primary coil and the secondary coil deteriorates.

To configure an impedance converting circuit with a transformer configuration or a multilayer coil such as a common-mode choke coil, the above-mentioned wiring outside the areas where the coil conductors are formed becomes an obstacle to size reduction. That is, some distance for maintaining an insulated state is necessary between an interlayer connection conductor that connects layers and a coil conductor. As a result, it is necessary to reduce the size of the areas where the coil conductors are formed. On the other hand, as the areas where the coil conductors are formed become smaller, the inductance obtained per layer becomes smaller. To obtain a desired inductance, it is necessary to increase the number of layers where coil conductors are formed. This results in not only the deterioration of the coupling coefficient, but also the deterioration of the Q value of the coils. To dispense with wiring in the multilayer body, wiring may be provided using side surface electrodes on the multilayer body. However, the degree of freedom in changing the positions of side surface electrodes on the multilayer body is very low since their positions are determined in advance according to sizes or usage.

To increase the coupling coefficient between the primary coil and the secondary coil, it is important that each of the primary coil and the secondary coil have coil conductors having an identical shape. FIGS. 8A and 8B are plan views of two substrate layers 11 and 12 on which coil conductors are formed. FIGS. 8C and 8D are plan views of the substrate layers 11 and 12 laminated together. FIG. 8A illustrates an example where a coil conductor equivalent to substantially one turn is formed on each of two substrate layers, and a power feeding terminal P1, an antenna terminal P2, and a ground terminal P3 are formed at one end portion of the multilayer body. FIG. 8B illustrates an example where the above-mentioned terminals are formed at top/bottom and right/left portions of the multilayer body. In both cases, interlayer connection is established by an interlayer connection conductor V at a certain position of each coil conductor. Although the configuration illustrated in FIGS. 8A and 8C obtains a high coupling coefficient, the configuration has little degree of freedom with regard to positions for forming side surface electrodes. The configuration illustrated in FIGS. 8B and 8D does not obtain a high coupling coefficient.

To have a position for forming each terminal as a defined position, it is effective to form coil conductors over a plurality of layers. For example, as illustrated in FIG. 9, coil conductors are formed on a plurality of substrate layers 11 to 15, and interlayer connection conductors V1 to V4 are formed at certain positions. As a result, a coil equivalent to one or more turns can be formed, and terminals can be arranged at end portions, facing each other, of the multilayer body. However, this configuration requires many substrate layers, and it becomes difficult to obtain a necessary (small) inductance value.

SUMMARY OF THE INVENTION

Accordingly, preferred embodiments of the present invention provide a small transformer that has a certain inductance value, and a communication terminal device including the transformer.

A transformer according to a preferred embodiment of the present invention includes a multilayer body including a plurality of substrate layers that are laminated in a lamination direction; and a first coil element and a second coil element that are provided in the multilayer body, that overlap each other when seen in a plan view from the lamination direction of the plurality of substrate layers, and that are coupled to each other; wherein the first coil element includes a first coil conductor and a second coil conductor that are provided on different ones of the plurality of substrate layers and that overlap each other when seen in the plan view; wherein a first parallel connection portion is provided in a portion of the first coil element so that the first parallel connection portion includes a portion of the first coil conductor and a portion of the second coil conductor; and the first coil conductor and the second coil conductor are connected to each other at at least two places with interlayer connection conductors interposed therebetween.

With the above configuration, a coil that has a certain inductance even when there are planar shape and size limitations is able to be obtained. Since wiring not configuring a coil is unnecessary, each coil conductor with a large coil aperture is able to be located in a limited area, thus configuring a small coil with a certain inductance.

It is preferable that a first external terminal connected to a first end of the first coil conductor and a second external terminal connected to a first end of the second coil conductor be provided on the multilayer body. When the first coil conductor is traced from the first end of the first coil conductor, it is preferable that a position at which the parallel connection portion starts be a position that passes the first end of the second coil conductor. When the second coil conductor is traced from the first end of the second coil conductor, it is preferable that a position at which the parallel connection portion starts be a position that passes the first end of the first coil conductor. Accordingly, a parallel connection portion is able to be provided in accordance with the positions of the first external terminal and the second external terminal. That is, the shape of each coil conductor becomes an opened loop without being limited by the arrangement of the external terminals. Accordingly, the degree of freedom in designing the positions of the external terminals becomes high.

It is preferable that the transformer includes a power feeding terminal, an antenna terminal, and a ground terminal. It is preferable that the power feeding terminal be connected to a first end of the first coil element, the antenna terminal be connected to a second end of the first coil element and to a first end of the second coil element, and the ground terminal be connected to a second end of the second coil element. This results in an autotransformer configuration, thus obtaining a great impedance conversion ratio. Since terminals from the power feeding terminal to the antenna terminal are directly connected with the first coil element interposed therebetween, an increase in insertion loss caused by the transformer configuration is reduced.

It is preferable that the power feeding terminal, the antenna terminal, and the ground terminal be provided on a side surface of the multilayer body. Accordingly, the extension (wiring) distance to each terminal becomes the shortest, thus ensuring a large coil aperture.

It is preferable that the power feeding terminal be provided on a first side surface of the multilayer body, the antenna terminal be provided on a second side surface facing the first side surface of the multilayer body, and the ground terminal be provided on a third side surface of the multilayer body. Accordingly, the impedance converting circuit is able to be easily inserted into a signal transmission path between the power feeding circuit and the antenna and is able to be easily connected to ground by arranging the impedance converting circuit between the power feeding circuit and the antenna.

It is preferable that the substrate layers be dielectric, magnetic, or dielectric and magnetic. Accordingly, the degree of coupling between the first coil element and the second coil element becomes higher, and the impedance conversion ratio is able to be made greater. Since the coil conductor length of the first coil element and the second coil element, which is required to obtain a certain inductance, is made shorter, the impedance converting circuit becomes smaller.

A communication terminal device according to another preferred embodiment of the present invention includes an antenna that transmits and receives a radio-frequency signal, and a power feeding circuit for the antenna. The communication terminal device includes a transformer between the power feeding circuit and the antenna. Accordingly, since the communication terminal device includes the transformer which has a small size as well as a certain great impedance conversion ratio, the communication terminal device can include the small (lower-impedance) antenna, thereby reducing the overall size and insertion loss of the communication terminal device.

According to transformer of various preferred embodiments of the present invention, a small transformer that has a certain inductance value is provided. In addition, a communication terminal device including the transformer is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
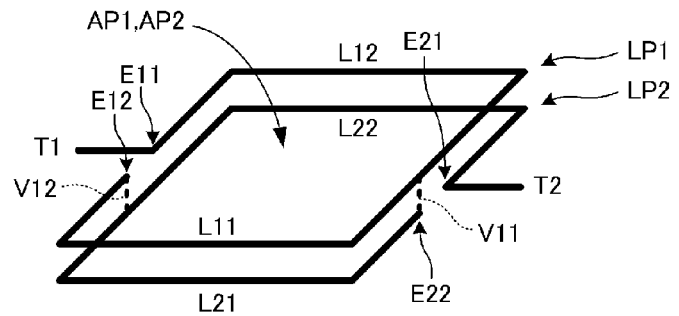
FIG. 1 is a perspective view illustrating only a conductor portion of a multilayer coil 10 according to a first preferred embodiment of the present invention.

Hereinafter, preferred embodiments of the present invention will be described by describing a number of specific examples with reference to the drawings. Like symbols denote like elements in the drawings. Each preferred embodiment is an illustrative example and various elements or features of the configurations illustrated in different preferred embodiments can be substituted or combined with each other.

First Preferred Embodiment

Figure 2:
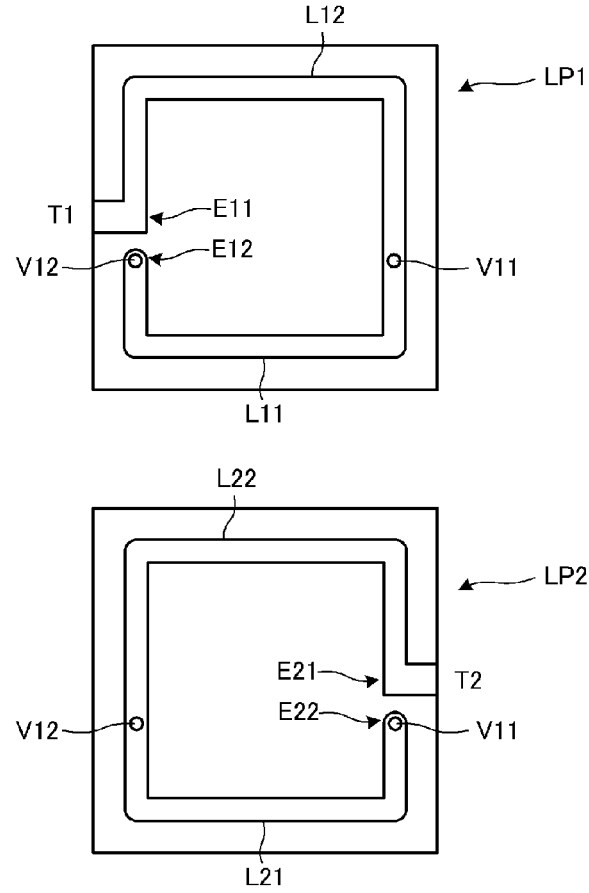
FIG. 2 is a plan view illustrating conductor patterns provided on two substrate layers of the multilayer coil 10.

FIG. 1 is a perspective view illustrating only a conductor portion of a multilayer coil 10 according to a first preferred embodiment of the present invention. FIG. 2 is a plan view illustrating conductor patterns provided on two substrate layers of the multilayer coil.

The multilayer coil 10 includes a first coil conductor LP1 and a second coil conductor LP2, which are provided on different substrate layers of a multilayer body including a plurality of substrate layers that are laminated. The multilayer coil 10 also includes interlayer connection conductors (vias) V11 and V12 to connect the first coil conductor LP1 and the second coil conductor LP2. A coil aperture AP1 defined by the first coil conductor LP1 and a coil aperture AP2 defined by the second coil conductor LP2 overlap each other when seen in a plan view from the laminating direction of the multilayer body.

The first coil conductor LP1 and the second coil conductor LP2 are connected to each other at two places with the interlayer connection conductors V11 and V12 interposed therebetween.

Figure 3:
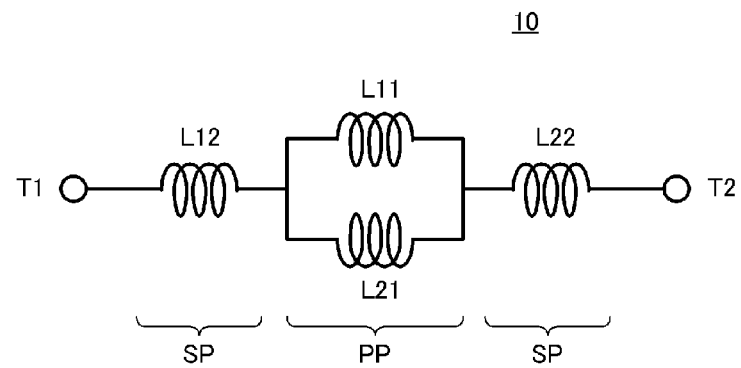
FIG. 3 is a circuit diagram of the multilayer coil 10.

FIG. 3 is a circuit diagram of the multilayer coil 10. As illustrated in FIG. 3, a parallel connection portion PP including a first portion L11 of the first coil conductor LP1 and a first portion L21 of the second coil conductor LP2 is provided. A series connection portion SP that is connected to the parallel connection portion PP and that includes a second portion L12 of the first coil conductor LP1 and a second portion L22 of the second coil conductor LP2 is provided. When inductances of the first portion L11 of the first coil conductor LP1 and the first portion L21 of the second coil conductor LP2 are denoted by L11 and L21, respectively, and inductances of the second portion L12 of the first coil conductor LP1 and the second portion L22 of the second coil conductor LP2 are denoted by L12 and L22, respectively, the inductance L of the multilayer coil 10 is represented as follows:

$$L=L12+L22+L11 \cdot L21/(L11+L21)$$

As illustrated in FIGS. 1 and 2, the first coil conductor LP1 of the multilayer coil 10 according to this preferred embodiment defines a coil of substantially one turn, and the second coil conductor LP2 defines a coil of substantially one turn. A first external terminal T1 connected to a first end E11 of the first coil conductor LP1 and a second external terminal T2 connected to a first end E21 of the second coil conductor LP2 are provided on the multilayer body. The first external terminal T1 and the second external terminal T2 are arranged at positions facing each other, with areas where the first coil conductor LP1 and the second coil conductor LP2 are located, being interposed therebetween.

In the multilayer coil 10, when the first coil conductor LP1 is traced clockwise from the first end E11 of the first coil conductor LP1, the position at which the interlayer connection conductor V11 is located, which is the position at which the parallel connection portion starts, is a position that passes the first end E21 of the second coil conductor LP2. When the second coil conductor LP2 is traced anti-clockwise from the first end E21 of the second coil conductor LP2, the position at which the interlayer connection conductor V12 is located, which is the position at which the parallel connection portion starts, is a position that passes the first end E11 of the first coil conductor LP1.

The above-discussed structure has the following effects.

The positions of the interlayer connection conductors V11 and V12 define the inductance of the parallel connection portion PP and the inductance of the series connection portion SP. Thus, the combined inductance of the multilayer coil 10 is able to be defined at a certain value using the positions of the interlayer connection conductors V11 and V12, without changing the coil apertures.

Wiring not configuring a coil is unnecessary, and the coil aperture AP1 defined by the first coil conductor LP1 and the coil aperture AP2 defined by the second coil conductor LP2 overlap each other when seen in a plan view from the laminating direction of the multilayer body. Thus, large coil apertures are able to be obtained with a limited planar size.

Each coil with a large coil aperture (each coil of substantially one turn on one substrate layer) is able to be provided in a limited area, and large coil apertures are able to be obtained with a limited planar size.

Since the first external terminal and the second external terminal are arranged at positions facing each other with the areas where the first coil conductor and the second coil conductor are located, being interposed therebetween, the external terminals is able to be easily extended.

When the first coil conductor is traced from the first end of the first coil conductor, the position at which the parallel connection portion starts is a position that passes the first end of the second coil conductor. When the second coil conductor is traced from the first end of the second coil conductor, the position at which the parallel connection portion starts is a position that passes the first end of the first coil conductor. Thus, the parallel connection portion is able to be provided in accordance with the positions of the first external terminal and the second external terminal. That is, the shape of each coil conductor becomes an opened loop without being limited by the arrangement of the external terminals. Accordingly, the degree of freedom in designing the positions of the external terminals becomes high.

It is preferable that the coil aperture AP1 defined by the first coil conductor LP1 and the coil aperture AP2 defined by the second coil conductor LP2 be such that the entirety of the coil aperture AP1 and the entirety of the coil aperture AP2 overlap each other when seen in a plan view from the laminating direction of the multilayer body. However, there may be a non-overlapping portion.

Second Preferred Embodiment

Figure 4:
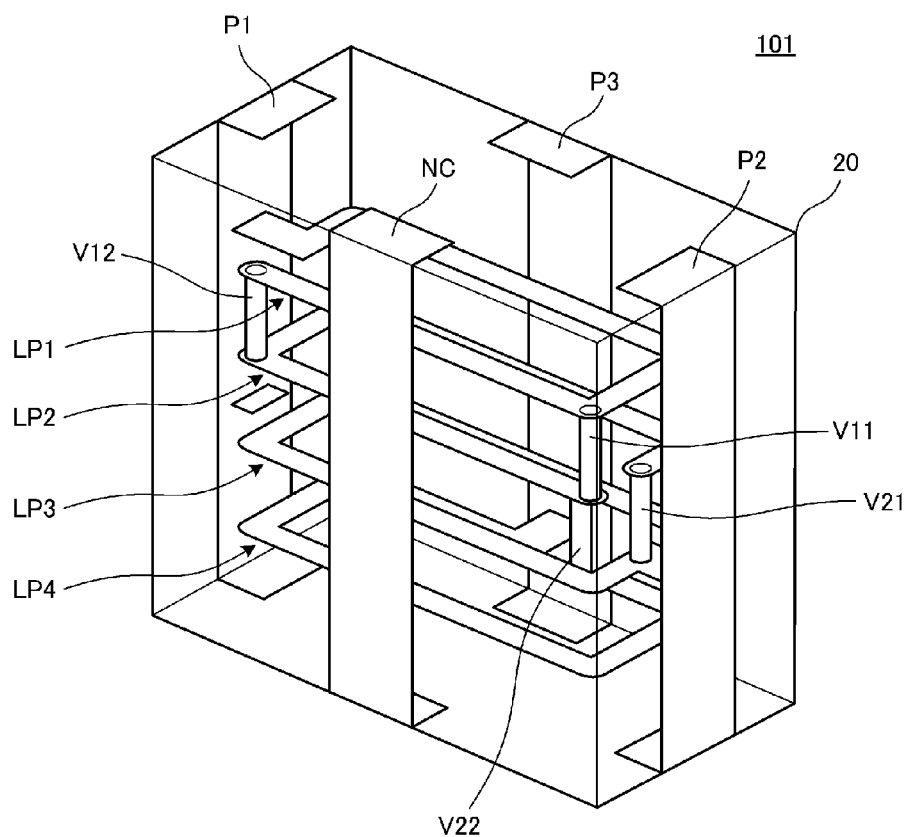
FIG. 4 is a perspective view of the interior of an impedance converting circuit 101 according to a second preferred embodiment of the present invention.

FIG. 4 is a perspective view of the interior of an impedance converting circuit 101 according to a second preferred embodiment of the present invention. Dimensions in the laminating direction are exaggerated to make the laminate structure easier to understand. The actual dimensions of a mounting surface preferably are 1.6 mm×0.8 mm, and a height thereof is 0.6 mm, for example.

As will be described later, a multilayer body 20 is provided by laminating a plurality of substrate layers.

Various conductor patters are provided on certain substrate layers among the plurality of substrate layers. Coil conductors LP1, LP2, LP3, and LP4 are provided on four substrate layers, respectively. The coil conductors LP1, LP2, LP3, and LP4 are interlayer-connected at certain positions by interlayer connection conductors (vias) V11, V12, V21, V22, and the like.

A first coil element is provided by including the two interlayer connection conductors V11 and V12 to interlayer-connect the first coil conductor LP1 and the second coil conductor LP2 at certain places, the first coil conductor LP1, and the second coil conductor LP2. Likewise, a second coil element is provided by including the two interlayer connection conductors to interlayer-connect the third coil conductor LP3 and the fourth coil conductor LP4 at certain places, the third coil conductor LP3, and the fourth coil conductor LP4.

A coil aperture defined by the first coil element and a coil aperture defined by the second coil element overlap each other when seen in a plan view from the laminating direction of the multilayer body 20.

A power feeding terminal P1, an antenna terminal P2, a ground terminal P3, and a non-connection terminal NC, which are external terminals, are provided on the outside surface of the multilayer body 20. Specifically, the power feeding terminal P1 is provided on a first side surface of the multilayer body 20, and the antenna terminal P2 is provided on a second side surface facing the first side surface. The ground terminal P3 is provided on a third side surface, and the non-connection terminal NC is provided on a fourth side surface facing the third side surface. The power feeding terminal P1, the antenna terminal P2, the ground terminal P3, and the non-connection terminal NC, which are connected to external terminals on side surfaces, are provided on a bottom surface and a top surface of the multilayer body 20.

A first end of the first coil element (one of two end portions of the first coil conductor LP1) has electrical continuity with the power feeding terminal P1. A first end of the second coil element (one of two end portions of the third coil conductor LP3) has electrical continuity with the antenna terminal P2. A second end of the second coil element (one of two end portions of the fourth coil conductor LP4) has electrical continuity with the ground terminal P3.

Figure 5:
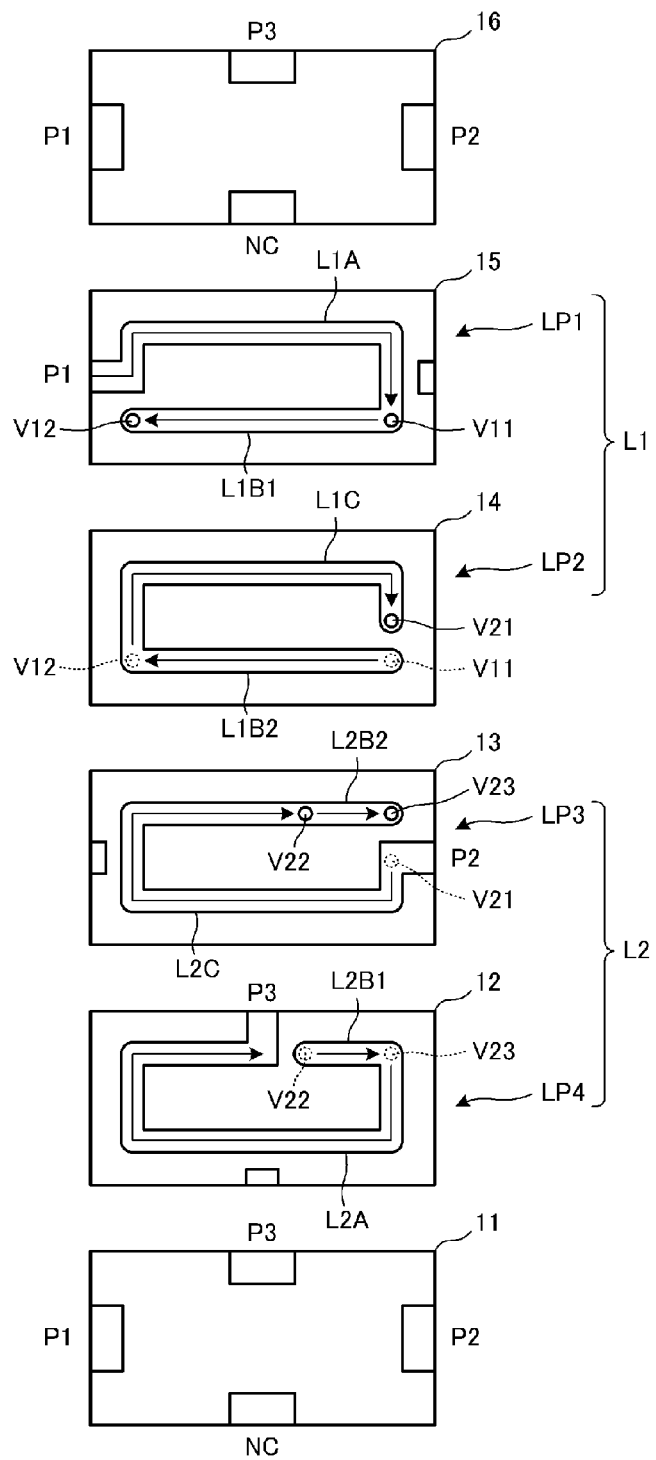
FIG. 5 is a diagram illustrating a conductor pattern formed on each substrate layer of the impedance converting circuit 101 and a current path.

FIG. 5 is a diagram illustrating a conductor pattern provided on each substrate layer of the impedance converting circuit 101 and a current path. The first coil conductor LP1 is provided on a substrate layer 15; the second coil conductor LP2 is provided on a substrate layer 14; the third coil conductor LP3 is provided on a substrate layer 13; and the fourth coil conductor LP4 is provided on a substrate layer 12. The first coil conductor LP1 and the second coil conductor LP2 define a portion of the first coil element L1. The third coil conductor LP3 and the fourth coil conductor LP4 define a portion of the second coil element L2.

The first coil conductor LP1 and the second coil conductor LP2 are interlayer-connected to each other at two places by the interlayer connection conductors V11 and V12. A conductor pattern L1B1, which is a first portion of the first coil conductor LP1, and a conductor pattern L1B2, which is a first portion of the second coil conductor LP2, are connected in parallel to each other, with the two interlayer connection conductors V11 and V12 interposed therebetween.

One of two end portions of a conductor pattern L1A, which is a second portion of the first coil conductor LP1, has electrical continuity with the power feeding terminal P1. One of two end portions of a conductor pattern L1C, which is a second portion of the first coil conductor LP1, is connected to one of two end portions of a conductor pattern L2B2 of the third coil conductor LP3 with the interlayer connection conductor V21 interposed therebetween.

In this manner, the first coil conductor LP1 and the second coil conductor LP2 are partially connected in parallel to each other and are entirely connected in series to each other, with the interlayer connection conductors V11 and V12 interposed therebetween. The shape of the first coil element L1 is an opened loop.

The third coil conductor LP3 and the fourth coil conductor LP4 are interlayer-connected to each other at two places by the interlayer connection conductors V22 and V23. The conductor pattern L2B2, which is a first portion of the third coil conductor LP3, and a conductor pattern L2B1, which is a first portion of the fourth coil conductor LP4, are connected in parallel to each other, with the two interlayer connection conductors V22 and V23 interposed therebetween.

One of two end portions of a conductor pattern L2C, which is a second portion of the third coil element LP3, has electrical continuity with the antenna terminal P2. One of two end portions of a conductor pattern L2A, which is a second portion of the fourth coil element LP4, has electrical continuity with the ground terminal P3.

In this manner, the third coil conductor LP3 and the fourth coil conductor LP4 are partially connected in parallel to each other and are entirely connected in series to each other, with the interlayer connection conductors V22 and V23 interposed therebetween. The shape of the second coil element L2 is an opened loop.

As illustrated in FIG. 5, the power feeding terminal P1, which is connected to an end portion of the first coil element L1, is located outside (side surface) of the multilayer body, and the interlayer connection conductor V12 is located near the power feeding terminal P1. When a plurality of coil conductors defining the first coil element L1 are traced in a circumferential direction (clockwise direction in FIG. 5) from a first end (an end portion connected to the power feeding terminal P1) of the first coil element L1, the position at which parallel connection established by the interlayer connection conductor V11 starts (the position of the interlayer connection conductor V11) is a position that passes the surrounding of the antenna terminal P2 to which a second end of the first coil element L1 is connected. When a plurality of coil conductors defining the second coil element L2 are traced in a circumferential direction (anti-clockwise direction in FIG. 5) from a first end (an end portion connected to the ground terminal P3) of the second coil element L2, the position at which parallel connection established by the interlayer connection conductor V23 starts (the position of the interlayer connection conductor V23) is a position that passes the surrounding of the antenna terminal P2 to which a second end of the second coil element L2 is connected. When the plurality of coil conductors defining the second coil element L2 are traced in a circumferential direction (clockwise direction in FIG. 5) from the second end (an end portion connected to the antenna terminal P2) of the second coil element L2, the position at which parallel connection established by the interlayer connection conductor V22 starts (the position of the interlayer connection conductor V22) is a position that passes the surrounding of the ground terminal P3 to which the first end of the second coil element L2 is connected.

Referring to FIG. 5, current flows through the first coil conductor LP1 and the second coil conductor LP2 in a path in the following order: power feeding terminal P1, conductor pattern L1A, conductor pattern (L1B1+L1B2), conductor pattern L1C, and antenna terminal P2. Current flows through the third coil conductor LP3 and the fourth coil conductor LP4 in a path in the following order: antenna terminal P2, conductor pattern L2C, conductor pattern (L2B2+L2B1), conductor pattern L2A, and ground terminal P3.

The substrate layers 11 to 16 are dielectric (insulated) or magnetic layers. For example, the multilayer body may include dielectric ceramic green sheets, which may be laminated by pressure-bonding and fired. Alternatively, the multilayer body 20 may be formed by pressure-bonding resin sheets. Alternatively, the multilayer body 20 may be formed by laminating magnetic ceramic green sheets by pressure-bonding, and firing these sheets. Alternatively, the multilayer body 20 may be formed by pressure-bonding resin sheets through which a magnetic filler is dispersed. Further, only layers that define and function as a magnetic core may be magnetic, and the other layers may be dielectric. For example, the substrate layers 13, 14, and 15 among the plurality of substrate layers may be magnetic layers, and the other layers may be non-magnetic layers.

The degree of coupling between the first coil element L1 and the second coil element L2 becomes higher by providing the first coil element L1 and the second coil element in the magnetic multilayer body as described above, thus increasing mutual inductance. In doing so, the impedance conversion ratio is able to be made greater. Since the coil conductor length of the first coil element L1 and the second coil element L2, which is required to obtain a certain inductance, is shorter, the impedance converting circuit 101 becomes even smaller.

The shape of the multilayer body 20 preferably is a rectangular or substantially rectangular parallelepiped. When seen in a plan view, the power feeding terminal P1 and the antenna terminal P2 are located at the center of two short sides, and the ground terminal P3 and the non-connection terminal NC are located at the center of two long sides. Therefore, the impedance converting circuit 101 is able to be easily arranged somewhere in a signal transmission path between a power feeding circuit and an antenna. In particular, when the signal transmission path between the power feeding circuit and the antenna is a coplanar line, the power feeding terminal P1 and the antenna terminal P2 are able to be connected to a center conductor, and the ground terminal P3 and the non-connection terminal NC are able to be easily connected to a ground conductor of a circuit substrate. That is, there is no need to provide a wiring pattern or a special land pattern to connect each terminal, and the impedance converting circuit 101 is easily mounted on a circuit substrate.

Figure 6A:
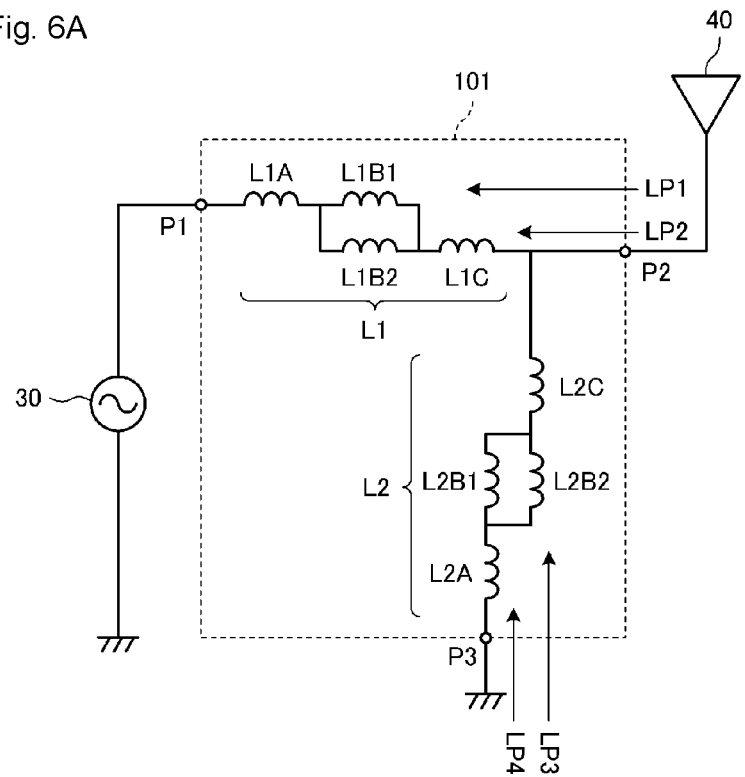
FIG. 6A is a circuit diagram of the impedance converting circuit 101 illustrated in FIGS. 4 and 5.
Figure 6B:
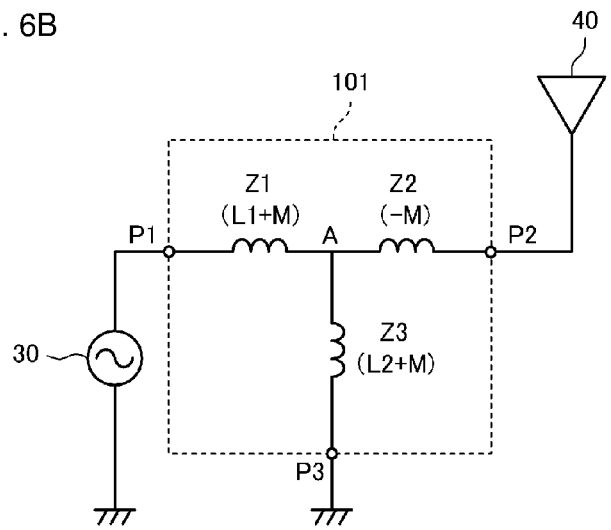
FIG. 6B is an equivalent circuit diagram of the impedance converting circuit 101.

FIG. 6A is a circuit diagram of the impedance converting circuit 101 illustrated in FIGS. 4 and 5, and FIG. 6B is an equivalent circuit diagram of the impedance converting circuit 101. A power feeding circuit 30 is connected to the power feeding terminal P1 of the impedance converting circuit 101, and an antenna 40 is connected to the antenna terminal P2. The ground terminal P3 is connected to ground.

The impedance converting circuit 101 includes the first coil element L1 connected to the power feeding terminal P1, and the second coil element L2 coupled to the first coil element L1. More specifically, the first end of the first coil element L1 is connected to the power feeding terminal P1, and the second end thereof is connected to the antenna terminal P2. The first end of the second coil element L2 is connected to the antenna terminal P2, and the second end thereof is connected to the ground terminal P3.

The impedance converting circuit 101 includes a transformer circuit in which the first coil element L1 and the second coil element L2 are tightly coupled to each other by using mutual inductance. The transformer circuit is able to be equivalently converted to a T-type circuit including three inductance elements Z1, Z2, and Z3, as illustrated in FIG. 6B. That is, the T-type circuit includes the power feeding terminal P1 connected to the power feeding circuit 30, the antenna terminal P2, the ground terminal P3, the inductance element Z1 connected between the power feeding terminal P1 and a node A, the inductance element Z2 connected between the antenna terminal P2 and the node A, and the third inductance element Z3 connected between the ground terminal P3 and the node A.

When mutual inductance achieved by coupling between the first coil element L1 and the second coil element L2 is denoted by M, the inductance of the first coil element L1 is denoted by L1, and the inductance of the second coil element L2 is denoted by L2, the inductances of the inductance elements Z1, Z2, and Z3 are as follows:

Z1: L1+M
Z2: −M
Z3: L2+M

The transformation ratio is (L1+L2+2M):L2.

The above-discussed structure has the following effects.

Since the coil apertures are able to have the same or substantially the same shape, the entirety of the coil aperture of the first coil element L1 and the entirety or substantially the entirety of the coil aperture of the second coil element L2 overlap each other. As a result, high electromagnetic coupling between the first coil element L1 and the second coil element L2 is obtained.

The interlayer connection conductors that connect the first coil conductor LP1 and the second coil conductor LP2 are located at the positions where the first coil conductor LP1 and the second coil conductor LP2 are located, and the interlayer connection conductors that connect the third coil conductor LP3 and the fourth coil conductor LP4 are located the positions where the third coil conductor LP3 and the fourth coil conductor LP4 are located. Accordingly, areas for forming interlayer connection conductors are unnecessary, and there is no need to form wiring outside the areas where the coil conductors are located. Thus, loop-shaped coil conductors are able to be provided in limited areas, thus achieving size reduction.

The four coil conductors LP1, LP2, LP3, and LP4 are partially connected in parallel to each other and are entirely connected in series to each other, with the interlayer connection conductors interposed therebetween. Thus, the inductances of the first coil element and the second coil element are easily defined at certain values.

When the coil conductors are traced from the first end of the first coil element L1, the position at which parallel connection established by each interlayer connection conductor starts is a position that passes the surrounding of an external terminal to which the second end of the first coil element is connected. When the coil conductors are traced from the first end of the second coil element L2, the position at which parallel connection established by each interlayer connection conductor starts is a position that passes the surrounding of an external terminal to which the second end of the second coil element is connected. Thus, the parallel connection portion is able to be provided in accordance with the positions of the external terminals. That is, the shape of each coil conductor becomes an opened loop without being limited by the arrangement of the external terminals. Accordingly, the degree of freedom in designing the positions of the external terminals becomes high.

Since interlayer connection is established using side surface electrodes on the multilayer body, interlayer connection conductors other than those that establish parallel connection become unnecessary in the multilayer body, and the magnetic aperture surfaces of the coil elements are able to be made larger. Thus, the overall size reduction is achieved. That is, a large coupling coefficient is able to be obtained with a small size.

Since an autotransformer is defined by the first coil element and the second coil element, the impedance conversion ratio is able to be made great because of the effect of mutual inductance (M) caused by the first coil element and the second coil element. Since terminals from the power feeding terminal to the antenna terminal are directly connected with the first coil element interposed therebetween, an increase in insertion loss caused by the transformer configuration is reduced.

Although it is preferable that the entirety of the coil aperture of the first coil element and the entirety of the coil aperture of the second coil element overlap each other when seen in a plan view from the laminating direction of the multilayer body, there may be a non-overlapping portion.

Third Preferred Embodiment

Figure 7:
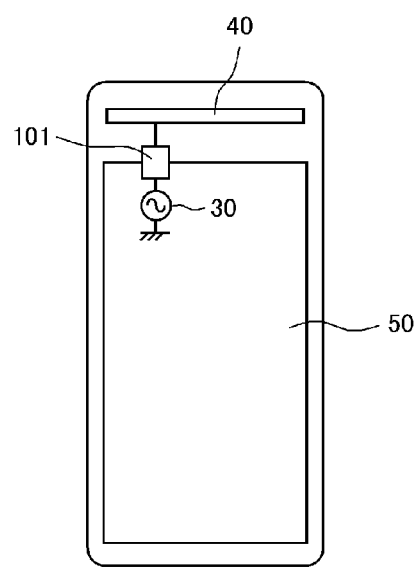
FIG. 7 is a diagram illustrating the configuration of a communication terminal device such as a cellular phone terminal according to a third preferred embodiment of the present invention.
Figure 8A:
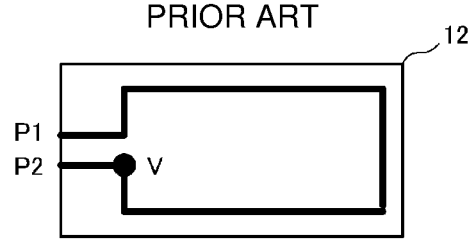
FIGS. 8A and 8B are plan views of two substrate layers 11 and 12 on which coil conductors are provided.
Figure 8B:
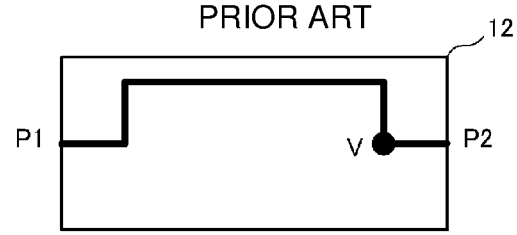
Figure 8B:
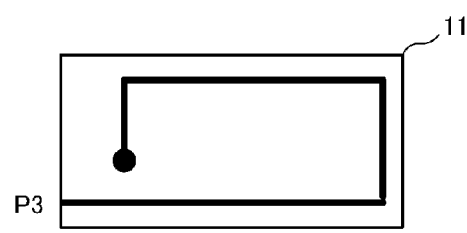
Figure 8B:
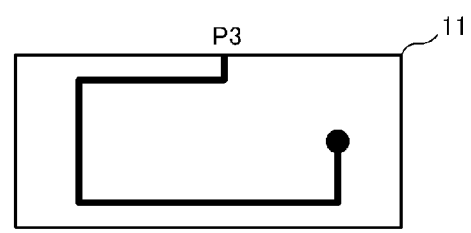
Figure 8C:
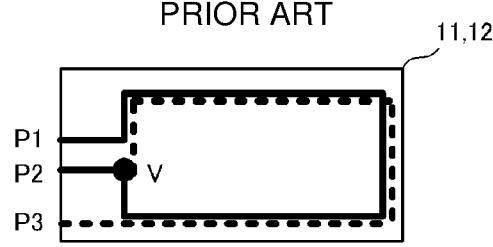
FIGS. 8C and 8D are plan views of the substrate layers 11 and 12 laminated together.
Figure 8D:
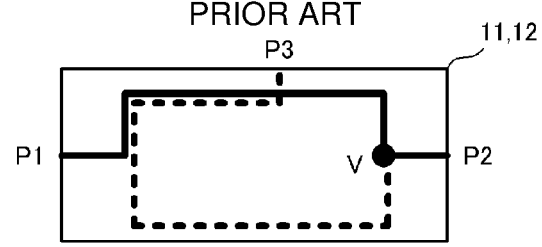
Figure 9:
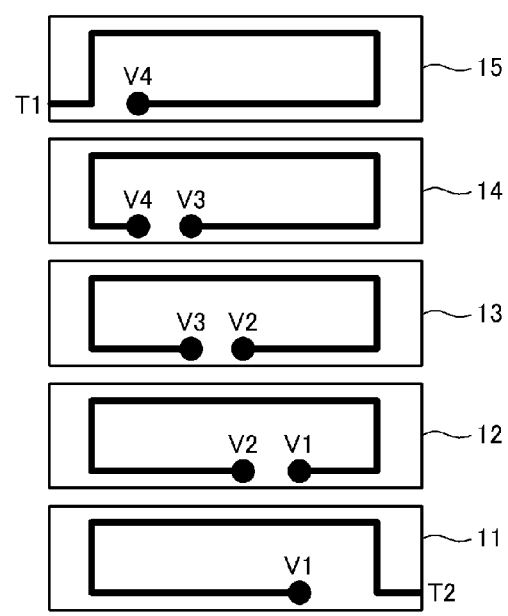
FIG. 9 is a plan view of a plurality of substrate layers where coil conductors are formed over these layers.

FIG. 7 is a diagram illustrating the configuration of a communication terminal device such as a cellular phone terminal according to a third preferred embodiment of the present invention. FIG. 7 only illustrates main portions in a housing of the communication terminal device. The antenna 40 and a circuit substrate are provided in the housing. A ground conductor 50, the impedance converting circuit 101, and the power feeding circuit 30 are provided on the circuit substrate. The antenna 40 is a T-branched antenna. The ground conductor 50 operates as an image forming conductor for the antenna 40, or operates together with the antenna 40 as a radiating element.

The structure of the impedance converting circuit 101 is as discussed in the second preferred embodiment. The power feeding terminal P1 of the impedance converting circuit 101 is connected to the power feeding circuit 30; the antenna terminal P2 of the impedance converting circuit 101 is connected to the antenna 40; and the ground terminal P3 of the impedance converting circuit 101 is connected to the ground conductor 50 of the circuit substrate.

Since the impedance converting circuit 101 is able to achieve a certain great impedance conversion ratio though it has a small size, the communication terminal device is able to include the small (lower-impedance) antenna 40, thus reducing the overall size and insertion loss of the communication terminal device.

Other Preferred Embodiments

Although the first and second preferred embodiments have discussed the examples where each coil conductor preferably has a rectangular or substantially rectangular loop shape, the loop shape of each coil conductor is not limited to this shape. For example, each coil conductor may have a circular or substantially circular shape, an elliptical or substantially elliptical shape, a rectangular or substantially rectangular shape with rounded corners, or a rectangular or substantially rectangular shape with notched corners. When each coil conductor has a rectangular or substantially rectangular shape, a coil aperture is able to be obtained with a limited space. When each coil conductor has a circular or substantially circular shape, an elliptical or substantially elliptical shape, or a rectangular or substantially rectangular shape with rounded corners, loss at each corner is able to be reduced.

Although the first and second preferred embodiments have discussed the examples where one parallel connection portion is provided by connecting two coil conductors located on adjacent substrate layers by using two interlayer connection conductors, the present invention is not limited to this configuration. Alternatively, two or more parallel connection portions each including the first coil conductor and the second coil conductor may be provided by connecting the first coil conductor and the second coil conductor to each other at three or more places with interlayer connection conductors interposed therebetween.

Various preferred embodiments of the present invention are similarly applicable to a multilayer coil such as a common-mode choke coil, besides an impedance converting circuit with a transformer configuration. For example, a first coil element and a second coil element are provided in a multilayer body such that coil apertures of the first coil element and the second coil element overlap each other when seen in a plan view from the laminating direction of the multilayer body, and two terminals of the first coil element and two terminals of the second coil element are provided on the multilayer body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transformer comprising:
    a multilayer body including a plurality of substrate layers that are laminated in a lamination direction; and
    a first coil element and a second coil element that are provided in the multilayer body, that overlap each other when seen in a plan view from the lamination direction of the plurality of substrate layers, and that are coupled to each other; wherein
    the first coil element includes:
        a first coil conductor and a second coil conductor that are provided on different ones of the plurality of substrate layers and that overlap each other when seen in the plan view; wherein
        a first parallel connection portion is provided in a portion of the first coil element so that the first parallel connection portion includes a portion of the first coil conductor and a portion of the second coil conductor; and
        the first coil conductor and the second coil conductor are connected to each other at at least two places with interlayer connection conductors interposed therebetween.

2. The transformer according to claim 1, wherein
    a first external terminal connected to a first end of the first coil element and a second external terminal connected to a second end of the first coil element are provided on the multilayer body; and
    when the first coil conductor is traced from a first end of the first coil conductor, a position at which the parallel connection portion starts is a position that passes a first end of the second coil conductor.

3. The transformer according to claim 2, wherein the substrate layers are dielectric, magnetic, or dielectric and magnetic.

4. The transformer according to claim 1, further comprising:
    a power feeding terminal, an antenna terminal, and a ground terminal; wherein
    the power feeding terminal is connected to a first end of the first coil element, the antenna terminal is connected to a second end of the first coil element and to a first end of the second coil element, and the ground terminal is connected to a second end of the second coil element.

5. The transformer according to claim 4, wherein the power feeding terminal, the antenna terminal, and the ground terminal are provided on a side surface of the multilayer body.

6. The transformer according to claim 5, wherein the power feeding terminal is provided on a first side surface of the multilayer body, the antenna terminal is provided on a second side surface facing the first side surface of the multilayer body, and the ground terminal is provided on a third side surface of the multilayer body.

7. The transformer according to claim 6, wherein the substrate layers are dielectric, magnetic, or dielectric and magnetic.

8. The transformer according to claim 5, wherein the substrate layers are dielectric, magnetic, or dielectric and magnetic.

9. The transformer according to claim 4, wherein the power feeding terminal is provided on a first side surface of the multilayer body, the antenna terminal is provided on a second side surface facing the first side surface of the multilayer body, and the ground terminal is provided on a third side surface of the multilayer body.

10. The transformer according to claim 9, wherein the substrate layers are dielectric, magnetic, or dielectric and magnetic.

11. The transformer according to claim 4, wherein the substrate layers are dielectric, magnetic, or dielectric and magnetic.

12. The transformer according to claim 1, wherein the substrate layers are dielectric, magnetic, or dielectric and magnetic.

13. The transformer according to claim 1, wherein
the second coil element includes a third coil conductor and a fourth coil conductor that are provided on different ones of the plurality of substrate layers and that overlap each other when seen in the plan view;
a second parallel connection portion is provided in a portion of the second coil element so that the second parallel connection portion includes a portion of the third coil conductor and a portion of the fourth coil conductor; and
the third coil conductor and the fourth coil conductor are connected at at least two places with interlayer connection conductors interposed therebetween.

14. The transformer according to claim 1, wherein the first parallel connection portion and the second parallel connection portion are located in different areas when seen in the plan view.

15. A communication terminal device comprising:
an antenna that transmits and receives a radio-frequency signal;
a power feeding circuit for the antenna; and
a transformer provided between the power feeding circuit and the antenna; wherein
the transformer includes:
a multilayer body including a plurality of substrate layers that are laminated in a lamination direction; and
a first coil element and a second coil element that are provided in the multilayer body, that overlap each other when seen in a plan view from the lamination direction of the plurality of substrate layers, and that are coupled to each other; wherein
the first coil element includes:
a first coil conductor and a second coil conductor that are provided on different ones of the plurality of substrate layers and that overlap each other when seen in a plan view; wherein
a first parallel connection portion is provided in a portion of the first coil element so that the first parallel connection portion includes a portion of the first coil conductor and a portion of the second coil conductor; and
the first coil conductor and the second coil conductor are connected to each other at at least two places with interlayer connection conductors interposed therebetween.

16. The communication terminal device according to claim 15, wherein
a first external terminal connected to a first end of the first coil element and a second external terminal connected to a second end of the first coil element are provided on the multilayer body; and
when the first coil conductor is traced from a first end of the first coil conductor, a position at which the parallel connection portion starts is a position that passes a first end of the second coil conductor.

17. The communication terminal device according to claim 15, further comprising:
a power feeding terminal, an antenna terminal, and a ground terminal; wherein
the power feeding terminal is connected to a first end of the first coil element, the antenna terminal is connected to a second end of the first coil element and to a first end of the second coil element, and the ground terminal is connected to a second end of the second coil element.

18. The communication terminal device according to claim 17, wherein the power feeding terminal, the antenna terminal, and the ground terminal are provided on a side surface of the multilayer body.

19. The communication terminal device according to claim 17, wherein the power feeding terminal is provided on a first side surface of the multilayer body, the antenna terminal is provided on a second side surface facing the first side surface of the multilayer body, and the ground terminal is provided on a third side surface of the multilayer body.

20. The communication terminal device according to claim 15, wherein the substrate layers are dielectric, magnetic, or dielectric and magnetic.

* * * * *